US009976918B2

(12) United States Patent
Lee et al.

(10) Patent No.: US 9,976,918 B2
(45) Date of Patent: May 22, 2018

(54) PRESSURE SENSING DEVICE HAVING DIRAC MATERIAL AND METHOD OF OPERATING THE SAME

(71) Applicant: INDUSTRIY-UNIVERSITY COOPERATION FOUNDATION HANYANG UNIVERSITY, Seoul (KR)

(72) Inventors: Seung-Beck Lee, Yongin-si (KR); Onejae Sul, Incheon (KR)

(73) Assignee: INDUSTRY-UNIVERSITY COOPERATION FOUNDATION HANYANG UNIVERSITY, Seoul (KR)

(*) Notice: Subject to any disclaimer, the term of this patent is extended or adjusted under 35 U.S.C. 154(b) by 0 days. days.

(21) Appl. No.: 15/192,466

(22) Filed: Jun. 24, 2016

(65) Prior Publication Data

US 2016/0377492 A1 Dec. 29, 2016

(30) Foreign Application Priority Data

Jun. 25, 2015 (KR) .................. 10-2015-0090446

(51) Int. Cl.
*G01L 5/00* (2006.01)
*G01L 1/00* (2006.01)
(Continued)

(52) U.S. Cl.
CPC .............. *G01L 1/005* (2013.01); *G01L 5/228* (2013.01); *G01L 1/148* (2013.01); *G01L 1/2293* (2013.01);
(Continued)

(58) Field of Classification Search
CPC ... H01L 29/1606; H01L 29/778; H01L 29/84; H01L 29/66015; H01L 29/66045;
(Continued)

(56) References Cited

U.S. PATENT DOCUMENTS 4,873,871 A * 10/1989 Bai .................... G01B 7/16
257/415
4,894,698 A * 1/1990 Hijikigawa ........... G01L 9/0098
257/254
(Continued)

FOREIGN PATENT DOCUMENTS

JP 2011-064688 A2 3/2011
JP 2011-196740 A2 10/2011

OTHER PUBLICATIONS

Sul et al. "Touch stimulated pulse generation in biomimetic single-layer graphene" Nanoscale, Jan. 16, 2016, vol. 8, 3425-3431. <http://pubs.rsc.org/en/Content/ArticleLanding/2016/NR/C5NR07115A>.*
(Continued)

*Primary Examiner* — Jonathan Dunlap
(74) *Attorney, Agent, or Firm* — Ladas & Parry LLP

(57) ABSTRACT

A pressure sensing device having a Dirac material and a method of operating the same are provided. The pressure sensing device includes a Dirac material pattern disposed on a substrate and having a band structure in which Dirac cones meet at a Dirac point. A source electrode and a drain electrode are respectively connected to the Dirac material pattern. A spacer layer including a cavity on the Dirac material pattern is disposed on the substrate. A gate electrode overlapping the Dirac material pattern is disposed on the cavity.

16 Claims, 6 Drawing Sheets

(51) Int. Cl.
*G01L 5/22* (2006.01)
*G01L 9/00* (2006.01)
*H01L 29/16* (2006.01)
*H01L 29/84* (2006.01)
*H01L 29/778* (2006.01)
*G01L 1/22* (2006.01)
*H01L 29/66* (2006.01)
*G01L 1/14* (2006.01)

(52) U.S. Cl.
CPC ........ *G01L 9/0098* (2013.01); *H01L 29/1606* (2013.01); *H01L 29/66015* (2013.01); *H01L 29/66045* (2013.01); *H01L 29/778* (2013.01); *H01L 29/84* (2013.01)

(58) Field of Classification Search
CPC ....... G01L 9/0098; G01L 1/005; G01L 1/148; G01L 1/2293
USPC ............. 257/E29.324, 254, 415, 27; 73/777, 73/862.626, 724
See application file for complete search history.

(56) References Cited

U.S. PATENT DOCUMENTS

| | | | | |
|---|---|---|---|---|
| 8,434,374 B2* | 5/2013 | Bhat | ................... | B81C 1/00246 73/777 |
| 8,459,128 B2* | 6/2013 | Bhat | ..................... | B81B 3/0072 73/777 |
| 8,592,888 B2* | 11/2013 | Kivioja | ............. | H01L 29/66015 257/318 |
| 8,878,790 B2* | 11/2014 | Abele | .................. | G06K 9/0002 257/254 |
| 8,975,669 B2* | 3/2015 | Jakovlev | ........................ | 257/254 |
| 2011/0023632 A1* | 2/2011 | Bhat | ..................... | B81B 3/0072 73/862.626 |
| 2013/0037780 A1* | 2/2013 | Kivioja | ................... | H01L 29/84 257/26 |
| 2014/0145148 A1* | 5/2014 | Lee | ........................ | H01L 29/775 257/29 |
| 2015/0137074 A1* | 5/2015 | Lee | ................... | H01L 29/66977 257/27 |
| 2015/0318401 A1* | 11/2015 | Duan | ................ | H01L 29/66742 250/200 |
| 2015/0318856 A1* | 11/2015 | Balandin | ................. | H03K 5/19 326/101 |

OTHER PUBLICATIONS

Lim et al. "Si-Compatible Cleaning Process for Graphene Using Low-Density Inductively Coupled Plasma" ACS Nano, Apr. 20, 2012, vol. 6, Issue 5, 4410-4417. <http://pubs.acs.org/doi/abs/10.1021/nn301093h>.*

Guo et al. "Graphene Doping: A Review" Insciences J. 2011, 1(2), 80-89. Apr. 27, 2011. <http://journal.insciences.org/wp-content/files_mf/1664_171x_1_2_80.pdf>.*

Paek et al. "Touch Pressure Sensor using Metal/PVDF-TrFE/Graphene Device". Extended Abstracts of the 2011 International Conference on Solid State Devices and Materials, Nagoya, 2011, 1331-1332. <http://gistexel.com/wp-content/uploads/2014/09/KM-7-2.pdf>.*

Joong Gun Oh; "Tunable Dirac Voltage of Graphene Field Effect Transistor with HfLaO Gate Dielectric and Development of RF Transistor Based on Graphene Using PVP Polymer Dielectric" Masters Thesis submitted to faculty of KAIST Dec. 14, 2011; 50 pages.

* cited by examiner

PRESSURE SENSING DEVICE HAVING DIRAC MATERIAL AND METHOD OF OPERATING THE SAME

CROSS-REFERENCE TO RELATED APPLICATION

This application claims priority to and the benefit of Korean Patent Application No. 2015-0090446, filed on Jun. 25, 2015, the disclosure of which is incorporated herein by reference in its entirety.

BACKGROUND

1. Field of the Invention

The present invention relates to a sensing device, and more particularly, to a pressure sensing device.

2. Discussion of Related Art

A tactile sensor refers to a sensor capable of sensing information of surrounding environments such as contact pressure, vibration, surface roughness, temperature change, etc. Such a tactile sensor is not only used for various medical diagnostics and surgeries, a sensation sensor for a prosthetic hand, etc. but expected to be used in technologies for implementing a virtual environment.

In addition, a tactile sensor is directed at imitating tactile sensibilities of humans, where humans are provided with a slow-adapting (SA) type receptor in which an intensity of output is proportional according to an intensity of stimulus such as merkel or ruffini receptors, and a fast-adapting (FA) type receptor which is more sensitive to a change in stimulus than an intensity of stimulus such as missner or pacinian receptors.

Both types of receptors may generate a pulse type electric signal by a stimulus being applied thereto. In the case of the SA type, a repetition rate of consecutive pulses changes according to intensity of a stimulus, and in the case of the FA type, a limited number of pulses are generated at a specific intensity of a stimulus according to a change in stimulus intensity. Humans distinguish various types of tactile sensations through time intervals between such pulses.

Most tactile sensors developed so far have been SA types in which an intensity of output is proportional according to an intensity of stimulus. On the other hand, research into the FA type which can only sense a change in stimulus and output an electrical signal of a pulse type has been lacking.

SUMMARY OF THE INVENTION

The present invention is directed to providing a fast-adapting (FA) type tactile sensor capable of sensing a change in stimulus and generating an electrical pulse which is an imitation of a firing signal of a human receptor.

According to an aspect of the present invention, there is provided a pressure sensing device. The pressure sensing device is provided with a Dirac material pattern disposed on a substrate and having a band structure in which Dirac cones meet at a Dirac point. A source electrode and a drain electrode are respectively connected to opposite ends of the Dirac material pattern. A spacer layer including a cavity on the Dirac material pattern is disposed on the substrate. A gate electrode overlapping the Dirac material pattern is disposed on the cavity.

The Dirac material pattern may be one of the Dirac materials described below. A Dirac material may refer to a material having a band structure in which two Dirac cones meet at a point. The Dirac material may include Pmmn boron; graphenes such as graphene, S-graphene, D-graphene, and E-graphene; graphynes such as α-graphyne, 6,6,12-graphyne, and 14,14,18-graphyne; silicene; germanene; a multilayer of a transition metal oxide such as $(VO_2)_n/(TiO_2)_m$ and $(CrO_2)_n/(TiO_2)_m$; SG-10b which is one of carbon allotropes; a single-walled hexagonal graphene antidote lattice (GAL); so_MoS$_2$; organic crystals such as α-(BEDT-TTF)$_2$I$_3$ in which BEDT-TTF is bis(ethylenedithio)-tetrathiafulvalene; organometallic crystals such as Pb$_2$(C$_6$H$_4$)$_3$, Ni$_2$(C$_6$H$_4$)$_3$ and Co$_2$(C$_6$H$_4$)$_3$; or Bi$_2$Se$_3$, but is not limited thereto.

An absolute value of a current flowing in the Dirac material pattern may be shown in a form of a pulse when a pressure applied to the gate electrode is increased or decreased. Specifically, a Fermi level of the Dirac material pattern may cross the Dirac point when the pressure applied to the gate electrode is increased or decreased. The number of electric charges ($n_0$) due to impurities of the Dirac material pattern may be in the range that satisfies any one of Expressions 6a and 6b below.

$$\frac{C_t^1 V_G}{Aq} < n_0 < \frac{C_t^2 V_G}{Aq} \qquad \text{[Expression 6a]}$$

(Here, both $V_G$ and $n_0$ are positive values.)

$$\frac{C_t^1 V_G}{Aq} > n_0 > \frac{C_t^2 V_G}{Aq} \qquad \text{[Expression 6b]}$$

(Here, both $V_G$ and $n_0$ are negative values.)

In the above Expressions 6a and 6b, $C_t^1$ may be capacitance between the gate electrode and the Dirac material pattern when a minimum pressure is applied to the gate electrode, $C_t^2$ may be capacitance between the gate electrode and the Dirac material pattern when a maximum pressure is applied to the gate electrode, $V_G$ may be a voltage applied to the gate electrode, A may be an area of a capacitor formed between the gate electrode and the Dirac material pattern, and q may be the unit electric charge.

A passivation layer may be disposed on the Dirac material pattern. A cover layer may be disposed on the gate electrode.

According to another aspect of the present invention, there is provided a method of manufacturing a pressure sensing device. First, a Dirac material pattern having a band structure in which Dirac cones meet at a Dirac point is formed on a substrate. A source electrode and a drain electrode respectively connected to opposite ends of the Dirac material pattern are formed. A spacer layer including a cavity on the Dirac material pattern is formed on the substrate. A gate electrode overlapping the Dirac material pattern is disposed on the spacer layer. A passivation layer is formed on the Dirac material pattern.

A position of a Fermi level of the Dirac material pattern may be regulated. The method may include thermally processing the Dirac material pattern and/or doping the Dirac material pattern.

According to still another aspect of the present invention, there is provided a method of operating a pressure sensing device. First, there is provided a pressure sensing device including a Dirac material pattern disposed on a substrate and having a band structure in which Dirac cones meet at a Dirac point, a source electrode and a drain electrode respectively connected to opposite ends of the Dirac material pattern, a spacer layer disposed on the substrate and provided with a cavity on the Dirac material pattern, and a gate electrode disposed on the cavity and configured to overlap the Dirac material pattern. A reference voltage is applied to the source electrode, a drain voltage is applied to the drain electrode, and a gate voltage is applied to the gate electrode. A drain current is measured while a pressure applied to the gate electrode is increased or decreased.

BRIEF DESCRIPTION OF THE DRAWINGS

The above and other objects, features and advantages of the present invention will become more apparent to those of ordinary skill in the art by describing embodiments thereof in detail with reference to the accompanying drawings, in which.

DETAILED DESCRIPTION OF EXEMPLARY EMBODIMENTS

Figure 1:
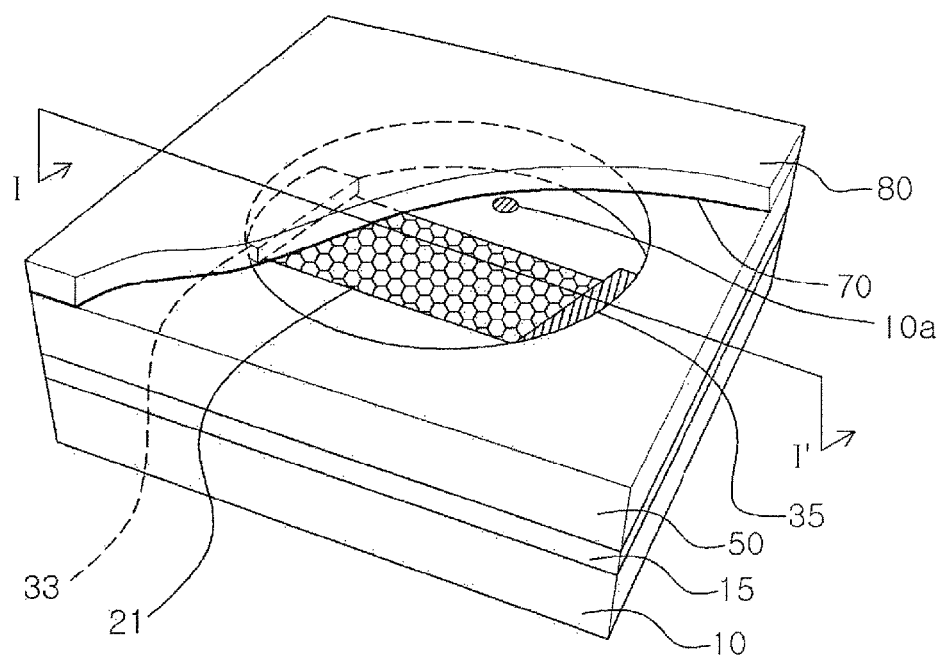
FIG. 1 is a partially-cut perspective view illustrating a pressure sensing device according to one embodiment of the present invention.

Hereinafter, a preferred embodiment according to the present invention will be described in detail with reference to the accompanying drawings. The present invention may, however, be embodied in various different forms, and is not to be construed as limited to the embodiments set forth herein. In the drawings, it should be understood that when a layer is referred to as being "on" another layer or a substrate, the layer may be formed directly on the other layer or the substrate, or there may be an intervening layer therebetween.

Figure 2:
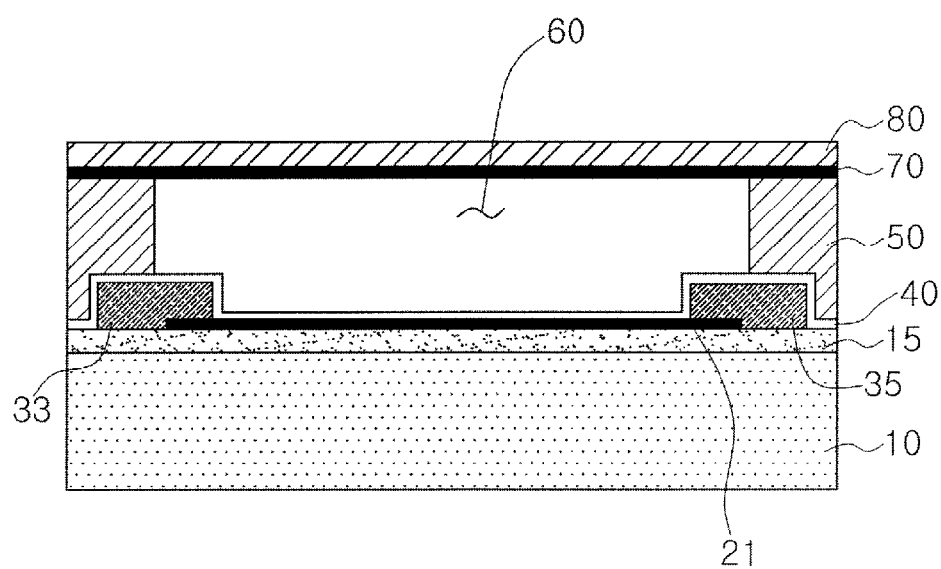
FIG. 2 is a cross-sectional view taken along line I-I' of FIG. 1.

FIG. 1 is a partially-cut perspective view illustrating a pressure sensing device according to one embodiment of the present invention. FIG. 2 is a cross-sectional view taken along line I-I' of FIG. 1. The pressure sensing device according to the embodiment represents one example of a tactile sensor.

Referring to FIGS. 1 and 2, a substrate 10 may be provided. The substrate 10 may be a conductive, semi-conductive, or insulating substrate. When the substrate 10 is a conductive or semi-conductive substrate, the substrate 10 may serve as a back gate. When the substrate 10 is a conductive substrate, the substrate 10 may be a metal substrate, for example, a copper substrate. When the substrate 10 is a semi-conductive substrate, the substrate 10 may, as an example, be a silicon substrate. When the substrate 10 is an insulating substrate, the substrate 10 may, as an example, be a polymer substrate.

An insulating layer 15 may be formed on the substrate 10. The insulating layer 15 may not be formed in the case that the substrate 10 is an insulating substrate. The insulating layer 15 may, as an example, be a silicon oxide layer or silicon nitride layer. When the substrate 10 serves as the back gate, a thickness of the insulating layer 15 may be adjusted so that a suitable electric field may be applied to a Dirac material pattern which will be described below.

A Dirac material pattern 21 (a 2-dimensional material pattern) which extends in one direction on a partial area of the insulating layer 15 may be formed. A Dirac material refers to a material having an electronic structure or band structure in which Dirac cones meet at a Dirac point, specifically a material having a band structure similar to a graphene. A Dirac material may be a 2-dimensional material or a bulk material. The 2-dimensional material refers to a very thin material having a nanometer-order thickness and may be a material with a 1 to 10-atom layer or a 1 to 5-atom layer, for example, a 1 to 2-atom layer. Since each atomic layer is an example of a crystal structure, the atomic layer may have a crystal structure like a hexagonal pattern of honeycomb shape, but is not limited thereto.

The Dirac material pattern 21 may be one of the Dirac materials described below. A Dirac material may include Pmmn boron; graphenes such as graphene, S-graphene, D-graphene, and E-graphene; graphynes such as α-graphyne, 6,6,12-graphyne, and 14,14,18-graphyne; silicene; germanene; a multilayer of transition metal oxides such as $(VO)_n/(TiO_2)_m$ and $(CrO_2)_n/(TiO_2)_m$; SG-10b which is one of carbon allotropes; a single-walled hexagonal graphene antidote lattice (GAL); so_$MoS_2$; organic crystals such as α-$(BEDT-TTF)_2I_3$ in which BEDT-TTF is bis(ethylenedithio)-tetrathiafulvalene; organometallic crystals such as $Pb_2(C_6H_4)_3$, $Ni_2(C_6H_4)_3$ and $Co_2(C_6H_4)_3$; or $Bi_2Se_3$, but is not limited thereto.

The Dirac material pattern 21 may be formed by forming a Dirac material layer on the insulating layer 15 and patterning the Dirac material layer. As an example, the Dirac material layer may be formed by directly growing a Dirac material layer through chemical vapor deposition (CVD) or the like after forming a catalytic layer on the insulating layer 15, or by a method of transferring a separately formed Dirac material layer onto the insulating layer 15. In the case that the Dirac material is a graphene layer, the method of separately forming the graphene layer and transferring the graphene layer onto the insulating layer 15 may include, for example, growing the graphene layer by CVD or the like on a copper foil, forming a polymethylmethacrylate (PMMA) layer on the graphene layer, etching the copper foil, transferring the graphene layer onto the insulating layer 15, and etching the PMMA layer on an upper portion of the graphene layer. However, the method is not limited thereto.

A source electrode 33 and a drain electrode 35 may be formed at opposite end portions of the Dirac material pattern 21. The source electrode 33 and the drain electrode 35 may, as an example, be formed using a lift-off method.

A position of Fermi level or Dirac voltage of the Dirac material pattern 21 may be regulated. This may include any one or both of a thermal process and a doping process for the Dirac material pattern 21.

The thermal process of the Dirac material pattern 21 may be performed in vacuum, in a reducing atmosphere such as a $H_2$ atmosphere, or in an inert gas atmosphere such as a $N_2$ atmosphere. In the case, residues adhered to the Dirac material pattern 21 such as water vapor, particles, etc. may be removed. As a result, the Fermi level of the Dirac material pattern 21 may be shifted close to the Dirac point, that is, the Dirac voltage may be regulated to be close to 0 V. Such a thermal process may be performed at a temperature of 200 to 400° C.

The doping process of the Dirac material pattern 21 may be performed by doping the Dirac material pattern 21 with a p-type dopant or n-type dopant. A p-type dopant serves the role of shifting the Fermi level of the Dirac material pattern 21 to a level lower than the Dirac point, that is, shifting the Dirac voltage in a positive direction, and an n-type dopant serves the role of shifting the Fermi level of the Dirac material pattern 21 to a level higher than the Dirac point, that is, shifting the Dirac voltage in a negative direction. However, when the Dirac material pattern 21 was excessively doped with a p-type dopant before the doping, the Fermi level of the Dirac material pattern 21 may be shifted close to the Dirac point, that is the Dirac voltage of the Dirac material pattern 21 may be shifted close to 0 V, by performing doping with an n-type dopant, and conversely, when the Dirac material pattern 21 was excessively doped with an n-type dopant before the doping, the Fermi level of the Dirac material pattern 21 may be shifted close to the Dirac point, that is, the Dirac voltage of the Dirac material pattern 21 may be shifted close to 0 V, by performing doping with a p-type dopant. When the Dirac material pattern 21 is a graphene pattern, the p-type dopant may be $HNO_3$, $AuCl_3$, $RhCl_3$, or a combination thereof, and the n-type dopant may be $NH_4F$. Such a doping with the dopants may include applying a solution containing any one of the dopants on the Dirac material pattern 21. Detailed examples of the impurities and methods of doping impurities are not limited to those described above.

A passivation layer 40 may be formed on the Dirac material pattern 21. The passivation layer 40 may serve the role of preventing impurities in the air from re-adhering to the Dirac material pattern 21, and forming the passivation layer 40 may prevent the Fermi level of the Dirac material pattern 21 from additionally or unexpectedly shifting. The passivation layer 40 may be a high permittivity layer which has a permittivity higher than silicon oxide, such as $HfO_2$ layer for example, but is not limited thereto. The passivation layer 40 may also be formed on patterns of the source electrode 33 and the drain electrode 35. The passivation layer 40 may have a thickness of 1 nm to 300 nm.

Next, a spacer layer 50 may be formed above the substrate on which the passivation layer 40 is formed. The spacer layer 50 may include a cavity 60 in which the passivation layer 40 formed on the Dirac material pattern 21 is exposed or in which the Dirac material pattern 21 is exposed when the passivation layer 40 is not formed. In other words, the spacer layer 50 may include the cavity 60 above the Dirac material pattern 21. The spacer layer 50 may be an epoxy layer, for example a polymer layer such as SU-8, but is not limited thereto. The spacer layer 50 may have a thickness of 100 nm to 100 μm.

A cover layer 80 which covers the cavity 60 may be disposed above the spacer layer 50. A gate electrode 70 is formed under the cover layer 80. The gate electrode 70 on the cavity 60 may be disposed overlapping the Dirac material pattern 21. The cover layer 80 is a flexible polymer layer, may be a polyethylene terephthalate (PET) layer, and a thickness thereof may be regulated to maintain flexibility. As an example, the thickness of the cover layer 80 may be in the range of 1 μm to 1 mm. The type and thickness of the gate electrode 70 may also be regulated to maintain the flexibility. For example, the gate electrode 70 may be a copper layer and the thickness thereof may be in the range of 10 nm to 100 nm.

Meanwhile, a medium may be filled in the cavity 60. As an example, the medium may be air, but is not limited thereto. In addition, a medium inlet/outlet 10a which penetrates through the substrate 10, the insulating layer 15, and the passivation layer 40 in a region in which the Dirac material pattern 21 is not formed may be disposed to connect the cavity 60 with the outside. During the operation of the pressure sensing device, the medium filling the cavity 60 may be discharged through the medium inlet/outlet 10a when the cover layer 80 and the gate electrode 70 are shifted in a downward direction due to a pressure applied thereto, and the medium may be introduced through the medium inlet/outlet 10a when the cover layer 80 and the gate electrode 70 are shifted back in an upper direction when the pressure is released. As a result, the pressure inside the cavity 60 may be maintained to be the same pressure as the outside of the pressure sensing device.

Figure 3:
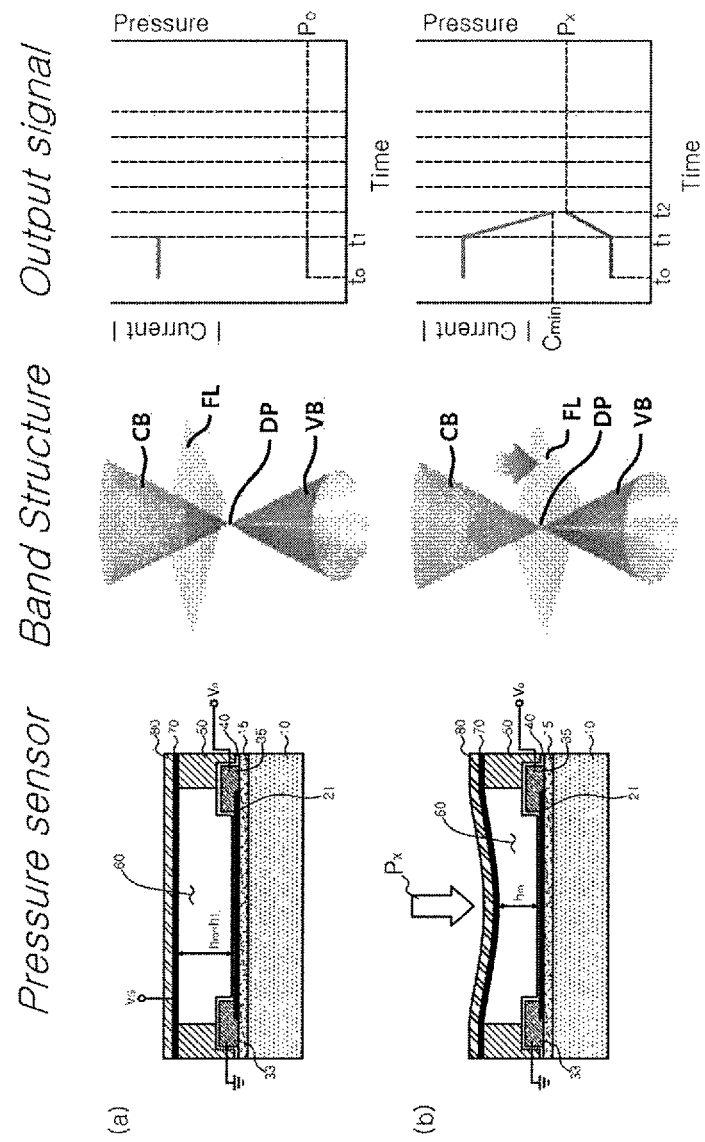
FIGS. 3 to 5 are schematic views for describing a method of operating the pressure sensing device according to one embodiment of the present invention.
Figure 4:
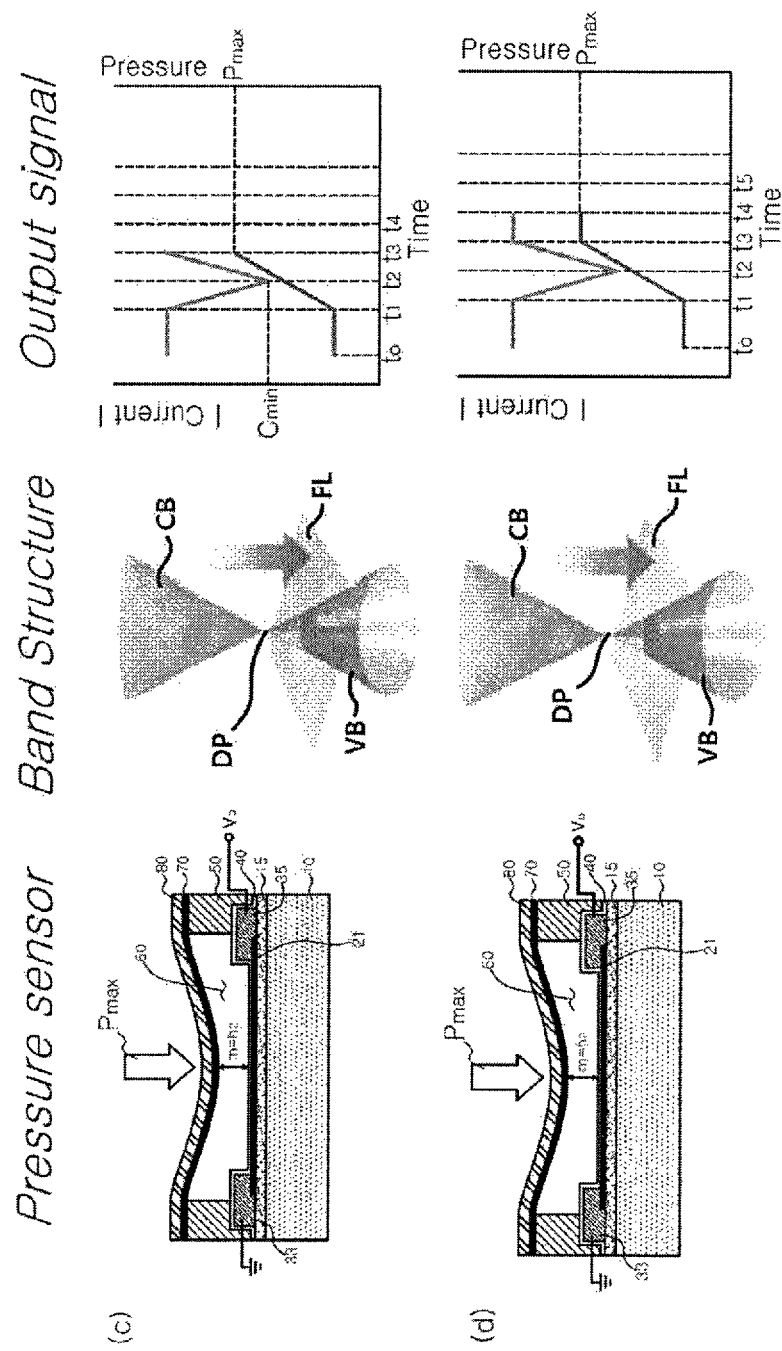
Figure 5:
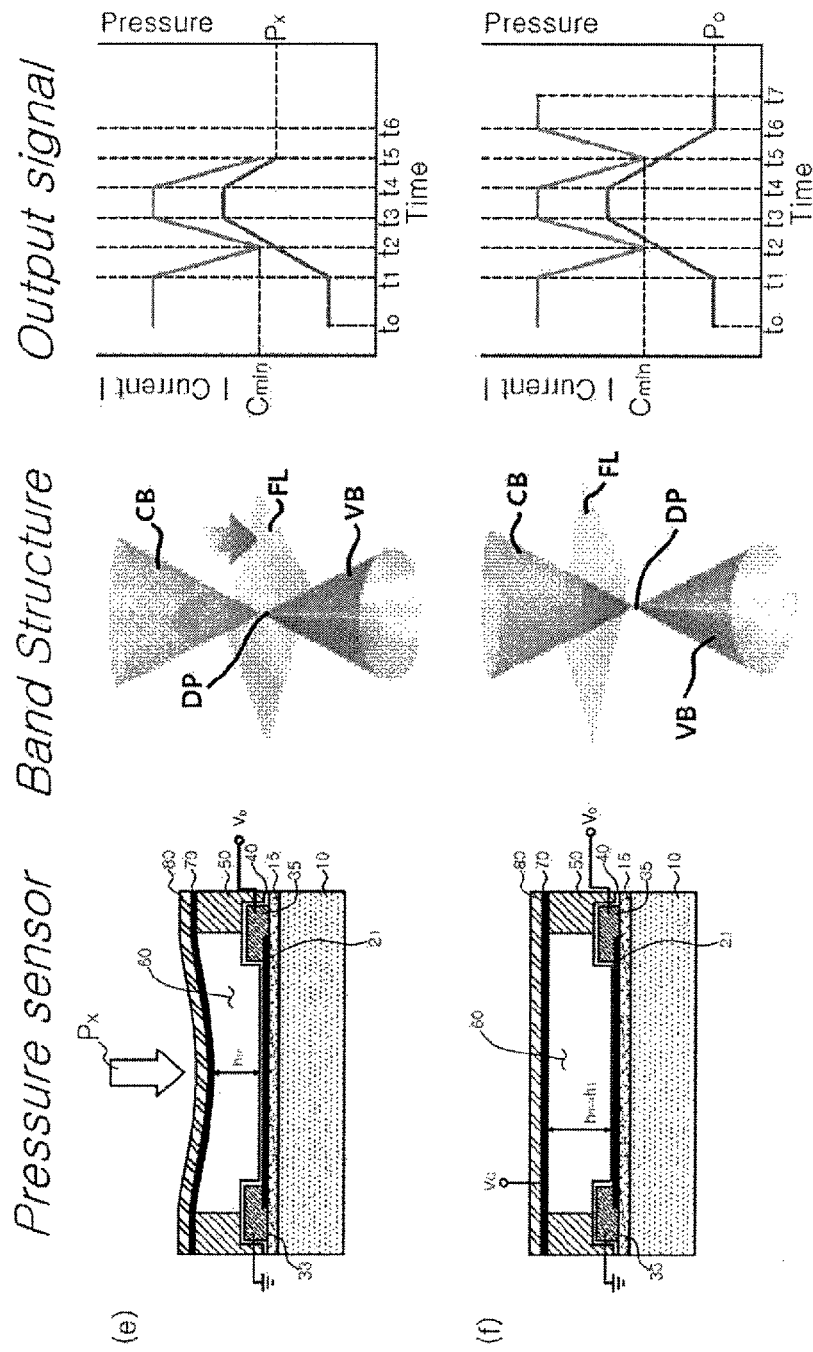

FIGS. 3 to 5 are schematic views for describing a method of operating the pressure sensing device according to one embodiment of the present invention.

Referring to FIGS. 3 to 5, a current flowing in the Dirac material pattern 21, i.e., a drain current, is measured while a gate voltage $V_G$ is applied to the gate electrode 70, a reference voltage is applied to the source electrode 33, and a drain voltage $V_D$ is applied to the drain electrode 35. The drain current is changed by a pressure applied to the gate electrode 70, and the existence and intensity of the pressure applied thereto may be measured by the drain current change and the changed amount thereof. To describe this, a band structure of the Dirac material pattern 21, an absolute value of the drain current according to time, and the pressure applied to the gate electrode 70 are illustrated. In the drawings, the Dirac material pattern 21 is doped with an n-type dopant and the gate voltage $V_G$ is illustrated as a negative value, but the present invention is not limited thereto, and when the Dirac material pattern 21 is doped with a p-type dopant, the gate voltage $V_G$ may be a positive value.

Stage (a) ($t_0 \rightarrow t_1$): The Stage in which a Pressure Applied to the Gate Electrode is $P_0$ A minimum pressure or an initial pressure $P_0$ may be applied to the gate electrode 70. Here, the minimum pressure may be zero, and in this case, an upper pressure and a lower pressure of the gate electrode 70 may be the same.

An electric charge amount according to Expression 1 may be generated in the Dirac material pattern 21.

$$qn = \frac{C_t}{A} V_G \quad \text{[Expression 1]}$$

In the above Expression 1, q represents a unit electric charge amount, n represents the number of electric charges in the Dirac material pattern, $C_t$ represents capacitance between the gate electrode and the Dirac material pattern, A represents the area of the capacitor formed between the gate electrode and the Dirac material pattern, i.e., the area of overlap of the gate electrode and the Dirac material pattern, and $V_G$ represents a gate voltage.

A position of the Fermi level in the Dirac material pattern may be represented by Expression 2 below.

$$E_F = \pm \hbar V_F \sqrt{\pi |n - n_0|} \quad \text{[Expression 2]}$$

In the above Expression 2, $E_F$ is a position of the Fermi level FL, $\hbar$ is a Planck's constant, $V_F$ is a charge carrier velocity in the Dirac material pattern, n is the number of the electric charges in the Dirac material pattern when the gate voltage $V_G$ is applied to the gate electrode, and $n_0$ is the number of the electric charges in the Dirac material pattern when the gate voltage is not applied and is the number of electric charges due to impurities in the Dirac material pattern.

The capacitance $C_t$ may be represented by Expression 3 below.

$$C_t = \frac{C_i C_m}{C_i + C_m} \approx C_m = \varepsilon_m \frac{A}{h_m} \quad \text{[Expression 3]}$$

In the above Expression 3 above, $C_i$ is capacitance of the passivation layer 40, and $C_m$ is capacitance of a medium layer which fills the inside of the cavity 60. The medium layer may be air. Since the passivation layer 40 is very thin in thickness as compared to the medium layer, for example an air layer, and a permittivity constant is also great especially in the case of a high permittivity layer, and hence the capacitance $C_i$ of the passivation layer 40 may be much greater than the capacitance $C_m$ of the medium layer, the denominator of Expression 3 may be very similar to the capacitance $C_i$ of the passivation layer 40. Therefore, the entire capacitance $C_t$ may be very similar to the capacitance $C_m$ of the medium layer. In addition, $\epsilon_m$ represents permittivity of the medium, $h_m$ represents a height of the medium, that is, a distance between the gate electrode 70 and the passivation layer 40 or a distance between the gate electrode 70 and the Dirac material pattern 21 when the passivation layer 40 is not formed, and A represents the area of the capacitor formed between the gate electrode 70 and the Dirac material pattern 21, i.e., the area of overlap of the gate electrode 70 and the Dirac material pattern 21.

When Expression 1 is substituted into Expression 2, the following Expression 4 may be obtained.

$$E_F = \pm \hbar V_F \sqrt{\pi} \sqrt{\left|\frac{C_t V_G}{Aq} - n_0\right|} \quad \text{[Expression 4]}$$

When the Fermi level FL is positioned at a Dirac point DP, $E_F$ may be zero. The gate voltage $V_G$ which shifts the Fermi level FL to the Dirac point DP may be represented by a Dirac voltage $V_0$. Meanwhile, as a height of a medium $h_m$ in the state of Stage (a) is $h_1$, $n_0$ may be represented by Expression 5 below.

$$n_0 = \frac{C_t V_0}{Aq} = \frac{\epsilon_m V_0}{q h_1} \quad \text{[Expression 5]}$$

In addition, in Stage (a) in which pressure is not applied, it may be preferable that the position of a Fermi level $E_F$ be in a conduction band CB when the Dirac material pattern 21 is doped with an n-type dopant, or the Fermi level FL be in a valence band VB when the Dirac material pattern 21 is doped with a p-type dopant. This is because the position of Fermi level $E_F$ of the Dirac material pattern 21 has to cross the Dirac point DP in the stage when a pressure is applied. To satisfy this, the gate voltage $V_G$ applied to the gate electrode 70 for sensing pressure, that is, a sensing voltage, has the same polarity as that of the Dirac voltage $V_0$, however the absolute value thereof may be less than that of the Dirac voltage $V_0$. In other words, the expression "$0<|V_G|<|V_0|$" may be satisfied on the condition that $V_G$ and $V_0$ have the same polarity. Specifically, the expression may be "$0>V_G>V_0$" when the Dirac material pattern 21 is doped with an n-type dopant and the Dirac voltage $V_0$ has a negative value, and may be "$0<V_G<V_0$" when the Dirac material pattern 21 is doped with a p-type dopant and the Dirac voltage $V_0$ has a positive value.

Stage (b) ($t_1 \to t_2$): the Stage in Which the Pressure Applied to the Gate Electrode is Increased from $P_0$ to $P_x$ A pressure is applied to the gate electrode 70 in the state of applying the same voltage as that in Stage (a). As the pressure is increased, the gate electrode 70 moves downward, and as the height of the medium in the cavity 60 is decreased, an electric field of the gate electrode 70 that influences the Dirac material pattern 21 may be strengthened. As a result, the Fermi level FL of the Dirac material pattern 21 may reach the Dirac point DP. Accordingly, the absolute value of the drain current may reach a minimum value $C_{min}$.

Stage (c) ($t_2 \to t_3$): the Stage in Which the Pressure Applied to the Gate Electrode is Increased from $P_x$ to $P_{max}$ More pressure is applied to the gate electrode 70 as compared to Stage (b) in the state of applying the same voltage as that in Stage (a). As the pressure is increased to a maximum pressure $P_{max}$, the gate electrode 70 further moves downward, and as the height of the medium in the cavity 60 is further decreased, the electric field of the gate electrode 70 that influences the Dirac material pattern 21 may be further strengthened. As a result, the Fermi level FL of the Dirac material pattern 21 crosses the Dirac point DP to be positioned in the opposite band, that is, positioned in the valence band VB when the Dirac material pattern 21 is doped with an n-type dopant, and may be in the conduction band CB when the Dirac material pattern 21 is doped with a p-type dopant. Accordingly, the absolute value of the drain current may be increased again.

As described above, the absolute value of the drain current or the conductance of the Dirac material pattern 21 is shown in a form of a pulse in the stages of applying pressure to the gate electrode 70, i.e. in Stages (b) and (c). To satisfy this, the Fermi level FL of the Dirac material pattern 21 may cross the Dirac point DP in the stages of applying the pressure to the gate electrode 70, i.e. in Stages (b) and (c). To this end, the pressure sensing device may satisfy Expression 6 and/or Expression 7 below.

In other words, since the position of the Fermi level FL has to cross the Dirac point DP while going from Stage (a) ($h_m = h1$) to Stage (b) ($h_m = h2$), this condition may be represented below when referenced to the above Expression 4.

$$\frac{C_t^1 V_G}{Aq} < n_0 < \frac{C_t^2 V_G}{Aq} \quad \text{[Expression 6a]}$$

(Here, both $V_G$ and $n_0$ are positive values.)

$$\frac{C_t^1 V_G}{Aq} > n_0 > \frac{C_t^2 V_G}{Aq} \quad \text{[Expression 6b]}$$

(Here, both $V_G$ and $n_0$ are negative values.)

In the above Expressions 6a and 6b, $C_t^1$ is the capacitance when the initial pressure $P_0$ is applied to the gate electrode 70, i.e. in the state of $h_m = h1$, and $C_t^2$ is the capacitance when the maximum pressure $P_{max}$ is applied to the gate electrode 70, i.e. in the state of $h_m = h2$.

When Expression 3 is substituted thereto, Expressions 7a and 7b may be obtained below.

$$\frac{\epsilon_m V_G}{q h_1} < n_0 < \frac{\epsilon_m V_G}{q h_2} \quad \text{[Expression 7a]}$$

(Here, both $V_G$ and $n_0$ are positive values.)

$$\frac{\epsilon_m V_G}{q h_1} > n_0 > \frac{\epsilon_m V_G}{q h_2} \quad \text{[Expression 7b]}$$

(Here, both $V_G$ and $n_0$ are negative values.)

When the above Expression 5 is substituted into Expressions 7a and 7b, Expressions 8a and 8b may be obtained below.

$$V_G < V_0 < \frac{h_1}{h_2}V_G \quad \text{[Expression 8a]}$$

(Here, both $V_G$ and $V_0$ are positive values.)

$$V_G > V_0 > \frac{h_1}{h_2}V_G \quad \text{[Expression 8b]}$$

(Here, both $V_G$ and $V_0$ are negative values.)

Stage (d) ($t_3 \rightarrow t_4$): the Stage in Which the Pressure Applied to the Gate Electrode is Maintained for a Predetermined Rime However, Stage (d) may be omitted.

Stage (e) ($t_4 \rightarrow t_5$): the Stage in Which the Pressure Applied to the Gate Electrode is Decreased from $P_{max}$ Back to $P_x$ The pressure applied to the gate electrode 70 is decreased to be $P_x$ in the state of applying the same voltage as that in Stage (a). As the pressure is decreased and the gate electrode 70 goes upwardly back, a height $h_m$ of the medium in the cavity 60 is increased again, and accordingly the electric field of the gate electrode 70 that influences the Dirac material pattern 21 may be weakened. As a result, the Fermi level FL of the Dirac material pattern 21 reaches the Dirac point DP again. Accordingly, the absolute value of the drain current may reach the minimum value $C_{min}$ again.

Stage (f) ($t_5 \rightarrow t_6 \rightarrow t_7$): the Stage in Which the Pressure Applied to the Gate Electrode is Decreased from $P_x$ Back to $P_0$ The pressure applied to the gate electrode 70 is gradually decreased, as compared to Stage (e), until the pressure reaches $P_0$ in the state of applying the same voltage as that in Stage (a). Then, the state may be maintained until reaching $t_7$. As the pressure is decreased and the gate electrode 70 goes upward to reach the original position thereof, the height $h_m$ of the medium in the cavity 60 further increases and goes back to the original position thereof. As a result, the electric field of the gate electrode 70 that influences the Dirac material pattern 21 may be further weakened. Accordingly, the Fermi level FL of the Dirac material pattern 21 crosses the Dirac point DP to be positioned in the original band thereof, that is, positioned in the conduction band CB when the Dirac material pattern 21 is doped with an n-type dopant, and in the valence band VB when the Dirac material pattern 21 is doped a p-type dopant. Accordingly, the absolute value of the drain current may be increased again.

As described above, the absolute value of the drain current or the conductance of the Dirac material pattern 21 may be shown in a form of a pulse once again in stages in which the pressure of the gate electrode 70 is decreased or the pressure applied is released, that is, in Stages (d) to (f). As described above, two pulses may be shown in the process of applying pressure to and removing pressure from the pressure sensing device.

Hereinafter, a preferred experimental example will be provided to help understanding of the present invention. However, the following experimental example is merely to help understand the present invention, but the present invention is not limited by the experimental example below.

Example of Manufacturing a Pressure Sensing Device

A pressure sensing device described with reference to FIGS. 1 and 2 was manufactured, wherein a silicon nitride layer serving as an insulating layer was formed to have a thickness of 85 nm on a silicon substrate using a plasma-enhanced chemical vapor deposition (PECVD) method. Next, a graphene layer was grown on a Cu foil, the graphene layer was coated with PMMA, the graphene coated with the PMMA was floated on an etchant to etch the Cu foil, the graphene/PMMA on which the Cu foil was etched was lifted out of the etchant, cleaned using deionized water (DI water) and dried, the PMMA was removed by annealing the graphene/PMMA for two hours in a furnace having a mixed atmosphere in which 4% of 1-12 is mixed with Ar at 400° C., and then the graphene was moved onto the silicon nitride layer. Electrodes of a source and a drain were formed by patterning thermally deposited Cr 5 nm/Au 50 nm by a lift-off method. Next, the graphene layer was patterned to form a graphene pattern and excessive p-type doping on the graphene pattern was reduced using an $NH_4F$ solution. $HfO_2$ was deposited on the graphene pattern using an atomic layer deposition (ALD) method. A spacer layer was formed to have about 2 μm height using SU-8 2002. Next, a gate electrode was attached to the bottom of a cover layer and then the gate electrode was attached to the spacer layer to face the graphene pattern.

Figure 6:
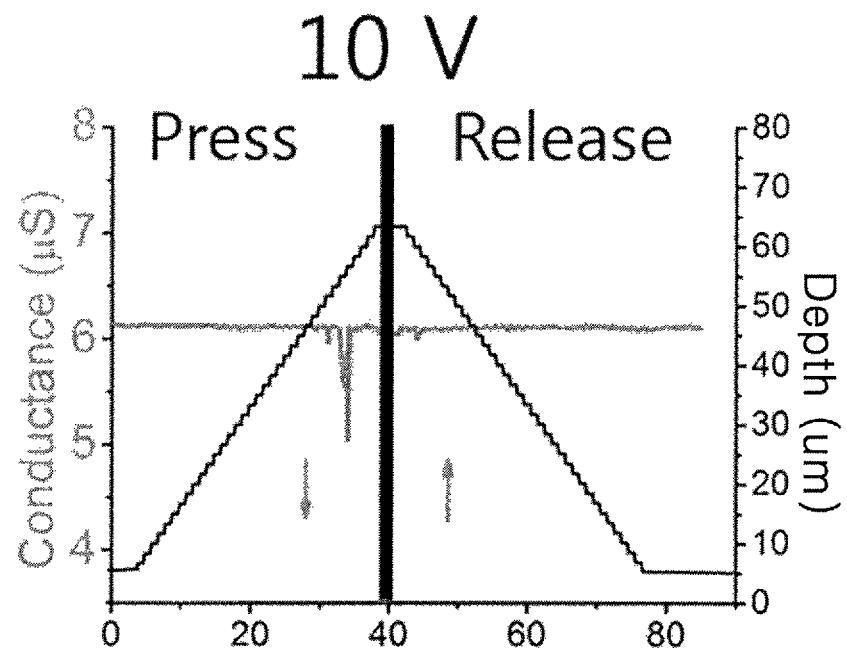
FIGS. 6 to 8 are graphs in which pressure sensing characteristics of a pressure sensing device according to a manufacturing example are measured.
Figure 7:
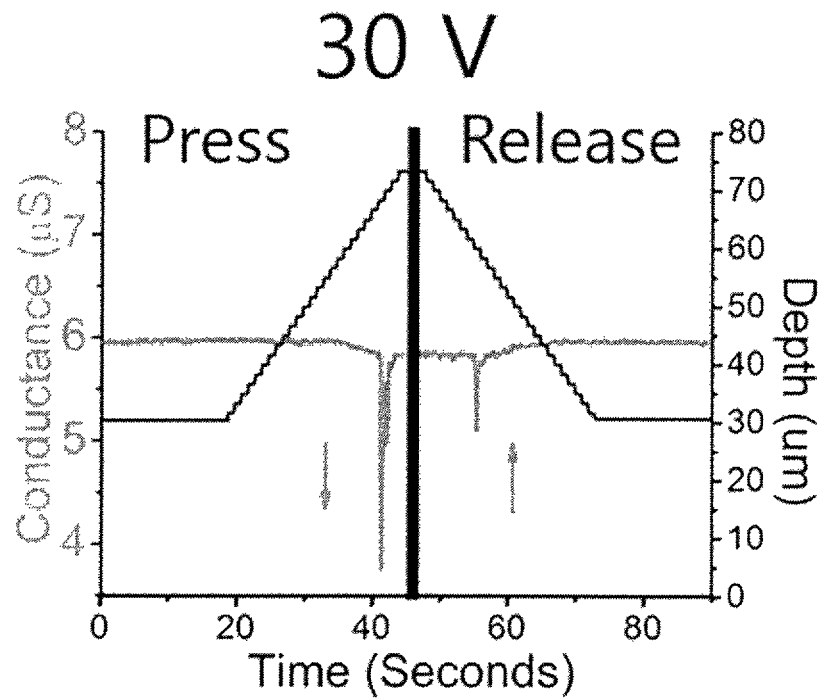
Figure 8:
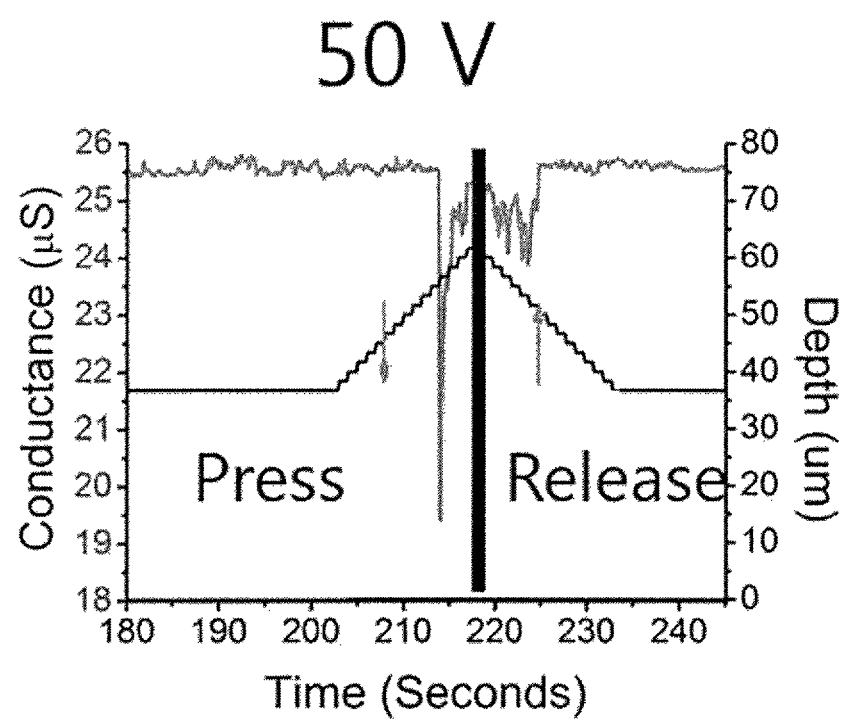

FIGS. 6 to 8 are graphs in which pressure sensing characteristics of the pressure sensing device according to the manufacturing example are measured.

Referring to FIGS. 6 to 8, it is seen that one pulse was generated in a process of increasing a pressure applied to the gate electrode, and another pulse was generated in a process of gradually releasing the pressure applied to the gate electrode.

In addition, it is seen that as a voltage applied to the gate electrode increases such as 10 V in FIG. 6, 30 V in FIG. 7, and 50 V in FIG. 8, an output signal, i.e. an amplitude of the pulse, was increased. However, the pressure applied was decreased as in going from FIG. 6 to FIG. 8. This represents that the pressure sensing device according to the embodiment of the present invention is more sensitive in sensing a time of applying and releasing a pressure than sensing a pressure size, and represents that a size of the output signal, i.e. sensitivity to pressure, may be regulated by regulating a pressure applied to the gate electrode.

As described above, according to the embodiment of the present invention, the FA type pressure sensing device in which a pulse is generated in an output signal in a process of applying a pressure to and releasing the pressure from the pressure sensing device can be implemented.

The effect of the present invention is not limited to the above-described effects, and further effects that are not described herein should be clearly understood by those skilled in the art from the above description.

While the present invention has been described with reference to certain preferred embodiments, it should be understood that simple modifications and changes made to the present invention fall within the scope of the present invention, and the protective scope of the present invention should become apparent by the appended claims.

What is claimed is:

1. A pressure sensing device comprising:
   a Dirac material pattern on a substrate and having a band structure in which Dirac cones meet at a Dirac point;
   a source electrode and a drain electrode respectively connected to opposite ends of the Dirac material pattern;
   a spacer layer on the substrate and provided with a cavity on the Dirac material pattern; and a gate electrode on the cavity and overlapping with the Dirac material pattern wherein the number of electric charges ($n_0$) due to impurities of the Dirac material pattern is in the range that satisfies any one of Expressions 6a and 6b below:

$$\frac{C_t^1 V_G}{Aq} < n_0 < \frac{C_t^2 V_G}{Aq} \quad \text{[Expression 6a]}$$

(here, both $V_G$ and $n_0$ are positive values)

$$\frac{C_t^1 V_G}{Aq} > n_0 > \frac{C_t^2 V_G}{Aq} \quad \text{[Expression 6b]}$$

(here, both $V_G$ and $n_0$ are negative values)

in the above Expressions 6a and 6b, $C_t^1$ is capacitance between the gate electrode and the Dirac material pattern when a minimum pressure is applied to the gate electrode, $C_t^2$ is capacitance between the gate electrode and the Dirac material pattern when a maximum pressure is applied to the gate electrode, $V_G$ is a voltage applied to the gate electrode, A is an area of the capacitor formed between the gate electrode and the Dirac material pattern, and q is a unit electric charge amount.

2. The pressure sensing device of claim 1, wherein the Dirac material pattern is a layer including one selected from a group consisting of Pmmn boron, graphenes, graphynes, silicene, germanene, (VO)$_n$/(TiO2)$_m$, (CrO2)$_n$/(TiO2)$_m$, SG-10b, a single-walled hexagonal graphene antidote lattice (GAL), so_MoS$_2$, α-(BEDT-TTF)$_{2|3}$, Pb$_2$(C$_6$H$_4$)$_3$, Ni$_2$(C$_6$H$_4$)$_3$, Co$_2$(C$_6$H$_4$)$_3$, and Bi$_2$Se$_3$.

3. The pressure sensing device of claim 1, wherein an absolute value of a current flowing in the Dirac material pattern is shown in a pulse when a pressure applied to the gate electrode is increased or decreased.

4. The pressure sensing device of claim 1, wherein a Fermi level of the Dirac material pattern crosses the Dirac point when the pressure applied to the gate electrode is increased or decreased.

5. The pressure sensing device of claim 1, further comprising a passivation layer on the Dirac material pattern.

6. The pressure sensing device of claim 1, further comprising a cover layer on the gate electrode.

7. A method of manufacturing a pressure sensing device, comprising:
forming a Dirac material pattern on a substrate having a band structure in which Dirac cones meet at a Dirac point;
forming a source electrode and a drain electrode respectively connected to the Dirac material pattern;
forming a spacer layer provided with a cavity disposed on the Dirac material pattern on the substrate; and
disposing a gate electrode on the spacer layer to overlap the Dirac material pattern
wherein the number of electric charges ($n_0$) due to impurities of the Dirac material pattern is in the range that satisfies any one of Expressions 6a and 6b below:

$$\frac{C_t^1 V_G}{Aq} < n_0 < \frac{C_t^2 V_G}{Aq} \quad \text{[Expression 6a]}$$

(here, both $V_G$ and $n_0$ are positive values)

$$\frac{C_t^1 V_G}{Aq} > n_0 > \frac{C_t^2 V_G}{Aq} \quad \text{[Expression 6b]}$$

(here, both $V_G$ and $n_0$ are negative values)

in the above Expressions 6a and 6b, $C_t^1$ is capacitance between the gate electrode and the Dirac material pattern when a minimum pressure is applied to the gate electrode, $C_t^2$ is capacitance between the gate electrode and the Dirac material pattern when a maximum pressure is applied to the gate electrode, $V_G$ is a voltage applied to the gate electrode, A is an area of the capacitor formed between the gate electrode and the Dirac material pattern, and q is a unit electric charge amount.

8. The method of claim 7, further comprising regulating a position of a Fermi level of the Dirac material pattern.

9. The method of claim 8, wherein the regulating of the position of the Fermi level of the Dirac material pattern includes thermally processing the Dirac material pattern.

10. The method of claim 8, wherein the regulating of the position of the Fermi level of the Dirac material pattern includes doping the Dirac material pattern.

11. The method of claim 7, further comprising forming a passivation layer on the Dirac material pattern.

12. A method of operating a pressure sensing device, comprising:
providing a pressure sensing device including a Dirac material pattern disposed on a substrate and having a band structure in which Dirac cones meet at a Dirac point, a source electrode and a drain electrode respectively connected to the Dirac material pattern, a spacer layer disposed on the substrate and provided with a cavity on the Dirac material pattern, and a gate electrode disposed on the cavity and configured to overlap the Dirac material pattern;
applying a reference voltage to the source electrode, a drain voltage to the drain electrode, and a gate voltage to the gate electrode; and
obtaining a pulse of an absolute value of a drain current while a pressure applied to the gate electrode is increased or decreased.

13. The method of claim 12, wherein a Fermi level of the Dirac material pattern crosses the Dirac point when the pressure applied to the gate electrode is increased or decreased.

14. The method of claim 12, wherein the number of electric charges ($n_0$) due to impurities of the Dirac material pattern is in the range that satisfies any one of Expressions 6a and 6b below:

$$\frac{C_t^1 V_G}{Aq} < n_0 < \frac{C_t^2 V_G}{Aq} \quad \text{[Expression 6a]}$$

(here, both $V_G$ and $n_0$ are positive values)

$$\frac{C_t^1 V_G}{Aq} > n_0 > \frac{C_t^2 V_G}{Aq} \quad \text{[Expression 6b]}$$

(here, both $V_G$ and $n_0$ are negative values)

in the above Expressions 6a and 6b, $C_t^1$ is capacitance between the gate electrode and the Dirac material pattern when a minimum pressure is applied to the gate electrode, $C_t^2$ is capacitance between the gate electrode and the Dirac material pattern when a maximum pressure is applied to the gate electrode, $V_G$ is the gate voltage, A is an area of a capacitor formed between the gate electrode and the Dirac material pattern, and q is a unit electric charge amount.

15. The method of claim 12, wherein the pressure sensing device further includes a passivation layer disposed on the Dirac material pattern.

16. The method of claim 12, wherein the pressure sensing device further includes a cover layer disposed on the gate electrode.

* * * * *